(12) United States Patent
Sikina et al.

(10) Patent No.: US 11,990,677 B2
(45) Date of Patent: May 21, 2024

(54) ORTHOGONAL PRINTED CIRCUIT BOARD INTERFACE

(71) Applicant: RAYTHEON COMPANY, Waltham, MA (US)

(72) Inventors: Thomas V. Sikina, Harvard, MA (US); Channing P. Favreau, Barre, MA (US); Erika Klek, Wilmington, MA (US)

(73) Assignee: RAYTHEON COMPANY, Waltham, MA (US)

( * ) Notice: Subject to any disclaimer, the term of this patent is extended or adjusted under 35 U.S.C. 154(b) by 460 days.

(21) Appl. No.: 17/200,155

(22) Filed: Mar. 12, 2021

(65) Prior Publication Data
US 2022/0294123 A1 Sep. 15, 2022

(51) Int. Cl.
*H01Q 21/00* (2006.01)
*H01Q 21/24* (2006.01)
*H05K 1/02* (2006.01)

(52) U.S. Cl.
CPC ......... *H01Q 21/0025* (2013.01); *H01Q 21/24* (2013.01); *H05K 1/0243* (2013.01); *H05K 2201/10098* (2013.01)

(58) Field of Classification Search
CPC .. H01Q 21/0025; H01Q 21/065; H01Q 21/00; H01Q 21/24; H05K 1/0243; H05K 2201/10098
See application file for complete search history.

(56) References Cited

U.S. PATENT DOCUMENTS

| | | | |
|---|---|---|---|
| 7,331,830 B2 | 2/2008 | Minich | |
| 7,532,171 B2 | 5/2009 | Chandler | |
| 9,806,432 B2 | 10/2017 | Little et al. | |
| 9,967,978 B1 | 5/2018 | Eiermann et al. | |
| 2020/0203834 A1 | 6/2020 | Asaf et al. | |
| 2020/0395678 A1* | 12/2020 | Shamblin | H05K 1/0243 |
| 2022/0344823 A1* | 10/2022 | Panther | H01Q 25/001 |

OTHER PUBLICATIONS

Al-Zayet et al.; A Dual Polarized Millimeter-Wave Multibeam Phased Array, University of Michigan, pp. 87-90 (Year: 2004).*
Al-Zayed et al., "A dual polarized millimetre-wave multibeam phased array" 2004 IEEE Mtt-S International Microwave Symposium Digest (IEEE Cat. No. 04CH37535) vol. 1 IEEE (Jun. 2004) Abstract Only (3 pages).

(Continued)

*Primary Examiner* — Hasan Islam
(74) *Attorney, Agent, or Firm* — CANTOR COLBURN LLP

(57) ABSTRACT

A dual-polarized PCB array antenna includes one or more PCBs and a radiating antenna array. Each PCB has a PCB mounting surface that extends from a first PCB end to an opposing second PCB end. The radiating antenna array includes one or more radiator substrates. Each radiator substrate has a patch mounting surface that extends from a first substrate end to an opposing second substrate end. The dual-polarized PCB array antenna further includes one or more orthogonal interfaces configured to arrange the patch mounting surface of a given radiator substrates in an orthogonal position with respect to the PCB mounting surface of a given PCB.

6 Claims, 7 Drawing Sheets

(56) References Cited

OTHER PUBLICATIONS

International Search Report and Written Opinion for International Application No. PCT/US2022/018601; Application Filing Date Mar. 3, 2022; dated Jun. 2, 2022 (17 pages).
Nikolic et al., "Millimetre wave stacked patch antenna design on a folded LCP substrate" 2014 IEEE Antennas and Propagation Society International Symposium (APSURSI) IEEE (Jul. 2014) Abstract Only (3 pages).
Pan et al., "A microstrip antenna with three-dimensional CPW feed" Microwave and Optical Technology Letters 24.4 (Feb. 2000) Abstract Only (2 pages).

\* cited by examiner

US 11,990,677 B2

ORTHOGONAL PRINTED CIRCUIT BOARD INTERFACE

BACKGROUND

The present disclosure relates to antennas and, in particular, to phased array antennas.

Phased array antennas (also referred to as "phased arrays") are used in communication, radar, and direction-finding systems as well as in other multifunction radio frequency (RF) systems. The phased array antenna typically includes an array of individual radiating antenna elements. The selection of the individual radiating element and arrangement of such elements affect the ability to efficiently transmit and receive RF signals having multiple polarizations.

One example of an architecture used to facilitate a phase array antenna is referred to as a "PCB array." The PCB array architecture typically implements two separate array packages on opposite surfaces of a relatively long printed circuit boards (PCBs), thus giving rise to the name of a "PCB" array. The large surface area existing across the depth of each individual PCB provides a large area to mount components and transmit/receive modules, while also distributing thermal loads across a large volume.

SUMMARY

According to a non-limiting embodiment, a dual-polarized PCB array antenna is provided. The dual-polarized PCB array antenna comprises a plurality of PCBS and a radiating antenna array. The plurality of PCBs, each PCB extends along a first axis to define a PCB width, a second axis orthogonal to the first axis to define a PCB height, and a third axis orthogonal to the first axis and the second axis to define a PCB length. Each PCB has a PCB mounting surface that extends along the second axis from a first PCB end to an opposing second PCB end and along the third axis from a third PCB end to a fourth PCB end. The radiating antenna array includes a plurality of radiator substrates. Each radiator substrate has a patch mounting surface that extends along the first axis from a first substrate end to an opposing second substrate end and the third axis from a third substrate end to an opposing fourth substrate end. The dual-polarized PCB array antenna further comprises a plurality of orthogonal interfaces configured to arrange the patch mounting surface of the plurality of radiator substrates in an orthogonal position with respect to the PCB mounting surface of the plurality of PCBs.

According to another non-limiting embodiment, an orthogonal printed circuit board (PCB) interface included in a dual-polarized array antenna is provided. The orthogonal PCB interface comprises a PCB and a radiator substrate. The PCB comprises a PCB mounting surface including a first plurality of electrically conductive elements. The radiator substrate comprises a patch mounting surface that includes a second plurality of electrically conductive elements. The second plurality of electrically conductive elements are coupled to the first plurality of electrically conductive elements such that the patch mounting surface of the radiator substrate is arranged in an orthogonal position with respect to the PCB mounting surface of the PCB.

According to yet another non-limiting embodiment, a shielded channel interface included in a dual-polarized printed circuit board (PCB) array antenna is provided. The shielded channel interface comprises a plurality of first electrically conductive elements coupled to a PCB mounting surface of a PCB, and a plurality of second electrically conductive elements coupled to a patch mounting surface of a radiator substrate. The plurality of second electrically conductive elements extend perpendicular from the patch mounting surface to establish electrical connections to the plurality of first electrically conductive elements. At least two first connections among the electrical connections are configured to receive a first signal and at least one second connection among the electrical connections is configured to receive a second signal different from the first signal, the at least one second connection interposed between the at least two first connections.

Additional features and advantages are realized through the techniques of the present disclosure. Other embodiments and aspects are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Various non-limiting embodiments described herein provide an orthogonal printed circuit board (PCB) interface for implementation in a dual-polarized PCB array antenna. The orthogonal printed circuit board (PCB) interface overcomes a technology gap that involves using only single PCB, while facilitating efficient dual-polarization via dual-polarized patch and stacked patch radiators integrated on a respective radiator substrate that is arranged orthogonally with respect to a mating PCB.

According to at least one non-limiting embodiment, the orthogonal PCB interface provides a high-efficiency connection between a radiator substrate arranged in an orthogonal position with respect to a PCB and completes the needed functionality to exchange signals in a phased array frontend. In addition, the orthogonal PCB interface provides minimal reflection coefficient performance within an operating frequency range compatible with contemporary phased arrays, along with also providing a minimal interference with electronic circuits and/or components (e.g., amplifiers, switches or hybrid circuits) included in the radiator substrate and the PCB. The orthogonal PCB interface also establishes a structural interface that provides a sufficient thermal boundary and exchange medium between the radiator substrate and the PCB. In this manner, the orthogonal PCB interface is capable of withstanding contemporary manufacturing processes and expected stress during phased array operation, transportation, and storage.

Figure 1:
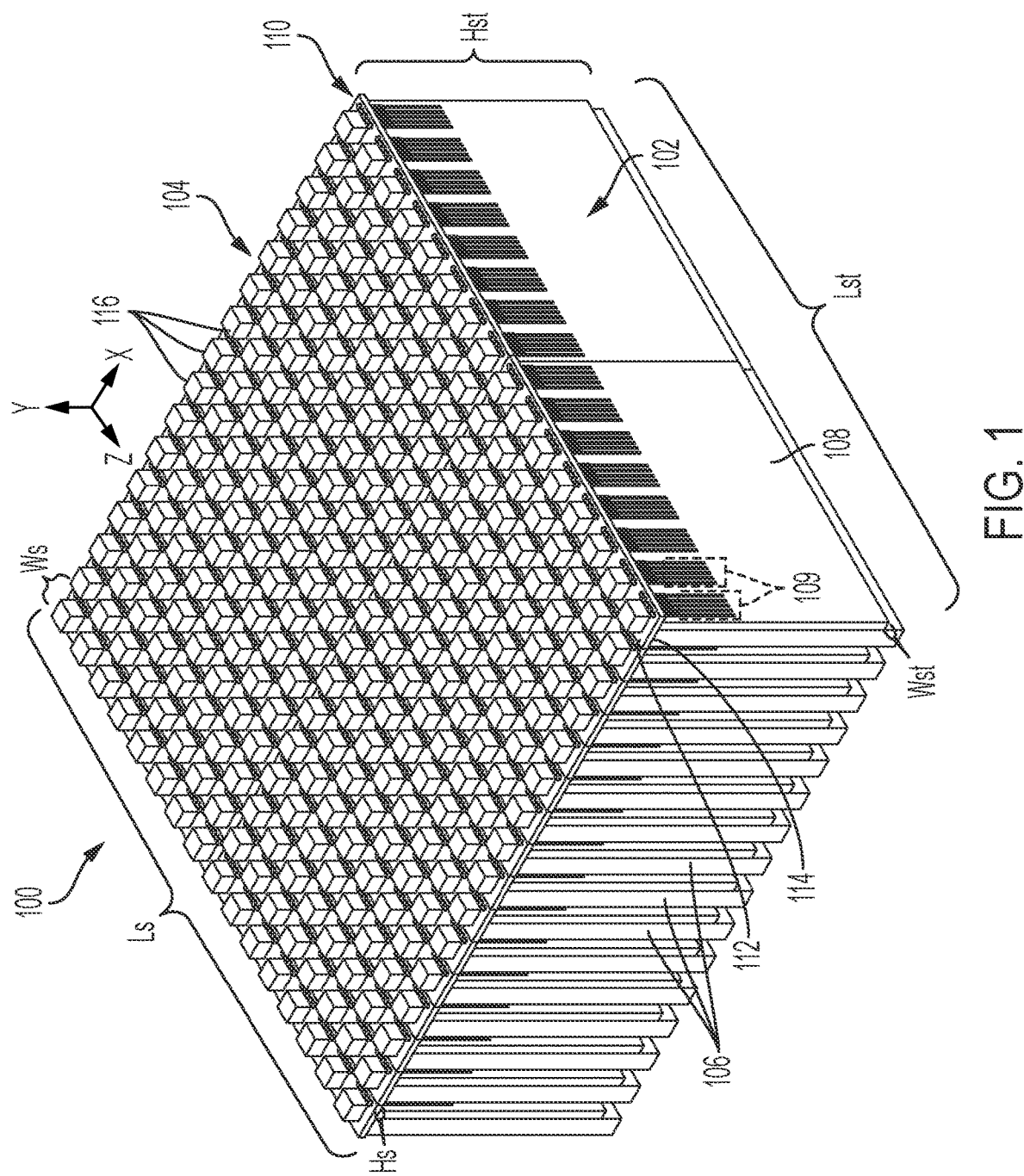
FIG. 1 is a perspective view of a dual-polarized PCB array antenna according to a non-limiting embodiment.

With reference now to FIG. 1, a dual-polarized PCB array antenna 100 is illustrated according to a non-limiting embodiment. The dual-polarized PCB array antenna 100 includes a plurality of individual PCBs 102 and a radiating antenna array 104. The PCBs 102 are arranged side-by-side along a first axis (e.g., an X-axis) and separated from one another by an air gap 106. Each PCB 102 extends along the first axis (e.g., the X-axis) to define a PCB width (Wst), a second axis (e.g., a Y-axis) orthogonal to the first axis to define a PCB height (Hst), and a third axis (e.g., a Z-axis) orthogonal to the X-axis and the Y-axis to define a PCB length (Lst). The PCBs 102 can be formed from various materials that provide a dielectric constant (k) ranging, for example, from about 2.0 to about 6, a dielectric loss tangent (tan δ) ranging, for example, from about 0.0005 to about 0.03, a coefficient of thermal expansion (CTE) ranging, for example, from about 10 ppm/° C. to about 220 ppm/° C. In one or more embodiments, the PCBs 102 can be fabricated as a printed circuit board (PCB) that includes various circuits, traces, and/or electrical components.

Each PCB 102 has a PCB mounting surface 108 that extends along the Y-axis from a first PCB end (e.g., an upper end) to an opposing second PCB end (e.g., a lower end) and along the Z-axis from a third PCB end (e.g., a left end) to a fourth PCB end (e.g., a right end). The PCB mounting surface 108 includes a plurality of trace clusters 109 arranged side-by-side along the Z-axis. The trace clusters 109 assist in facilitating an interface between a given PCB 102 and the radiating antenna array 104 as described in greater detail below.

The radiating antenna array 104 is disposed on the first PCB end of the plurality of PCBs 102 and is arranged orthogonally with respect to the PCB mounting surface 108. The radiating antenna array 104 includes a plurality of individual radiator substrates 110 arranged side-by-side along the X-axis. In one or more embodiments, the radiator substrates 110 can be fabricated as a printed circuit board (PCB) that includes various circuits, traces, and/or electrical component.

Each radiator substrate 110 is disposed on the first end of a respective PCB 102, and extends along the first axis (e.g., the X-axis) to define a substrate width (Ws), a second axis (e.g., a Y-axis) orthogonal to the first axis to define a substrate height (Hs), and a third axis (e.g., a Z-axis) orthogonal to the X-axis and the Y-axis to define a substrate length (Ls). The radiator substrates 110 can be formed from various materials that provide a dielectric constant (k) ranging, for example, from about 1 to about 4, a dielectric loss tangent (tan δ) ranging, for example, from about 0.0005 to about 0.03, a coefficient of thermal expansion (CTE) ranging, for example, from about 10 ppm/° C. to about 220 ppm/° C. In one or more embodiments, the radiator substrates 110 can be fabricated as a printed circuit board (PCB) that includes various circuits, traces, and/or electrical components.

Each radiator substrate 110 has a patch mounting surface 112 and an opposing contact surface 114 that extend along the X-axis from a first substrate end to an opposing second substrate end and the Z-axis from a third substrate end to an opposing fourth substrate end. Accordingly, the contact surface 114 is disposed directly against the first end of a respective PCB 102 such that the patch mounting surface 112 is arranged orthogonally with respect to the PCB mounting surface 108. In one or more non-limiting embodiments, the first and second ends of the radiator substrates 110 directly contact one another.

Each radiator substrate 110 includes a plurality of radiating antenna elements 116 disposed on the patch mounting surface 112 and arranged side-by-side along the Z-axis. Although the radiating antenna elements 116 are described as patch antennas 116 going forward, other types of radiating antenna elements 116 can be implemented without departing from the scope of the invention.

Figure 2:
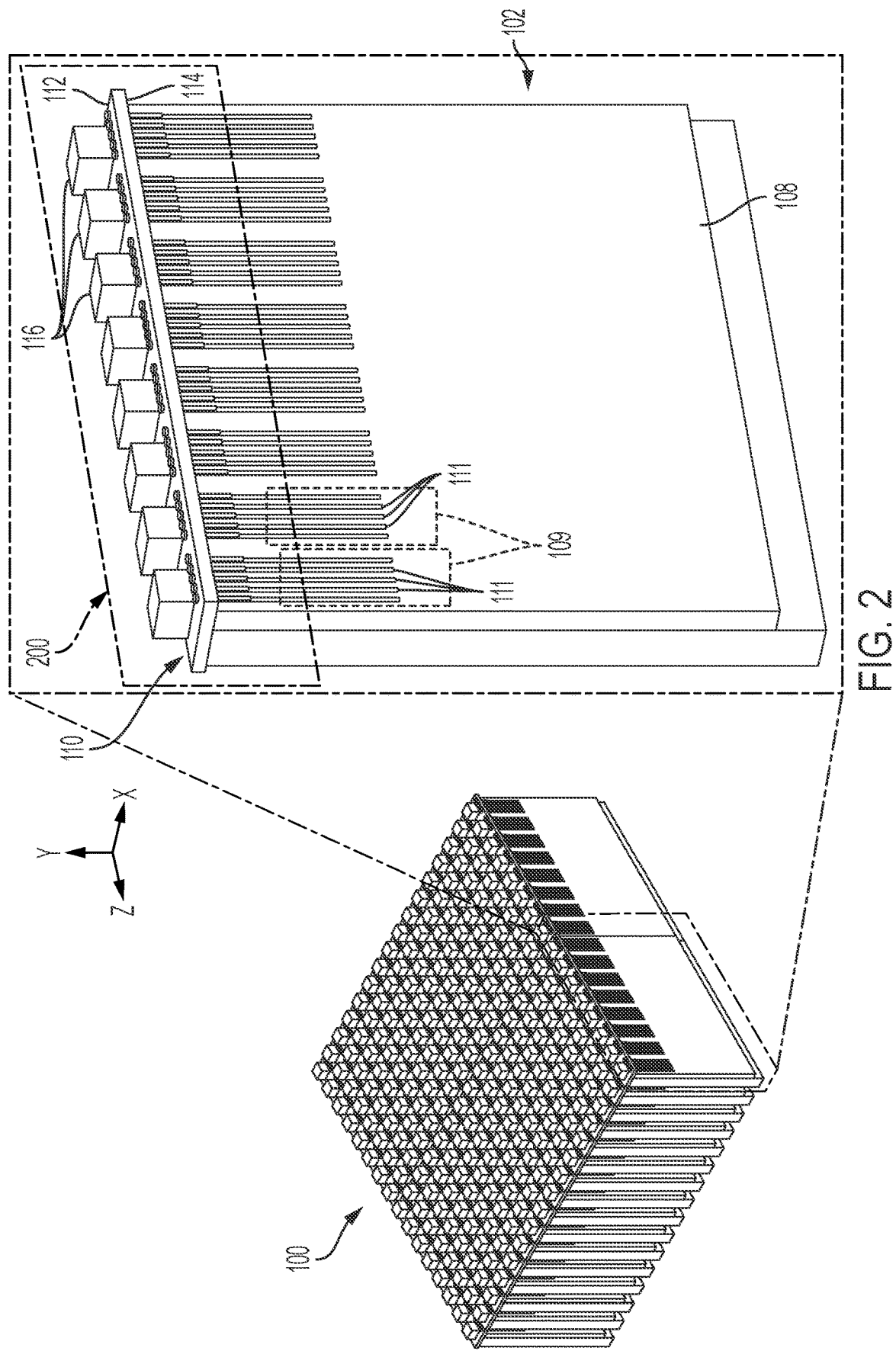
FIG. 2 depicts an orthogonal PCB interface included in the dual-polarized PCB array antenna shown in FIG. 1 according to a non-limiting embodiment.

Referring to FIG. 2, a PCB 102 and a radiator substrate 110 included in the dual-polarized PCB array antenna 100 are illustrated in greater detail. The PCB 102 is illustrated with trace clusters 109 that include a plurality of electrically conductive traces 111 formed on the PCB mounting surface 108. The traces 111 include an electrically conductive material (e.g., copper) and can be formed on the PCB mounting surface 108 using various fabrication processes such as, for example, printed circuit board (PCB) etching processes, additive manufacturing, (e.g., three-dimensional printing), etc. Although five traces 111 are shown, it should be appreciated that the trace clusters 109 can include more or less traces 111 without departing from the scope of the invention.

Figure 3:
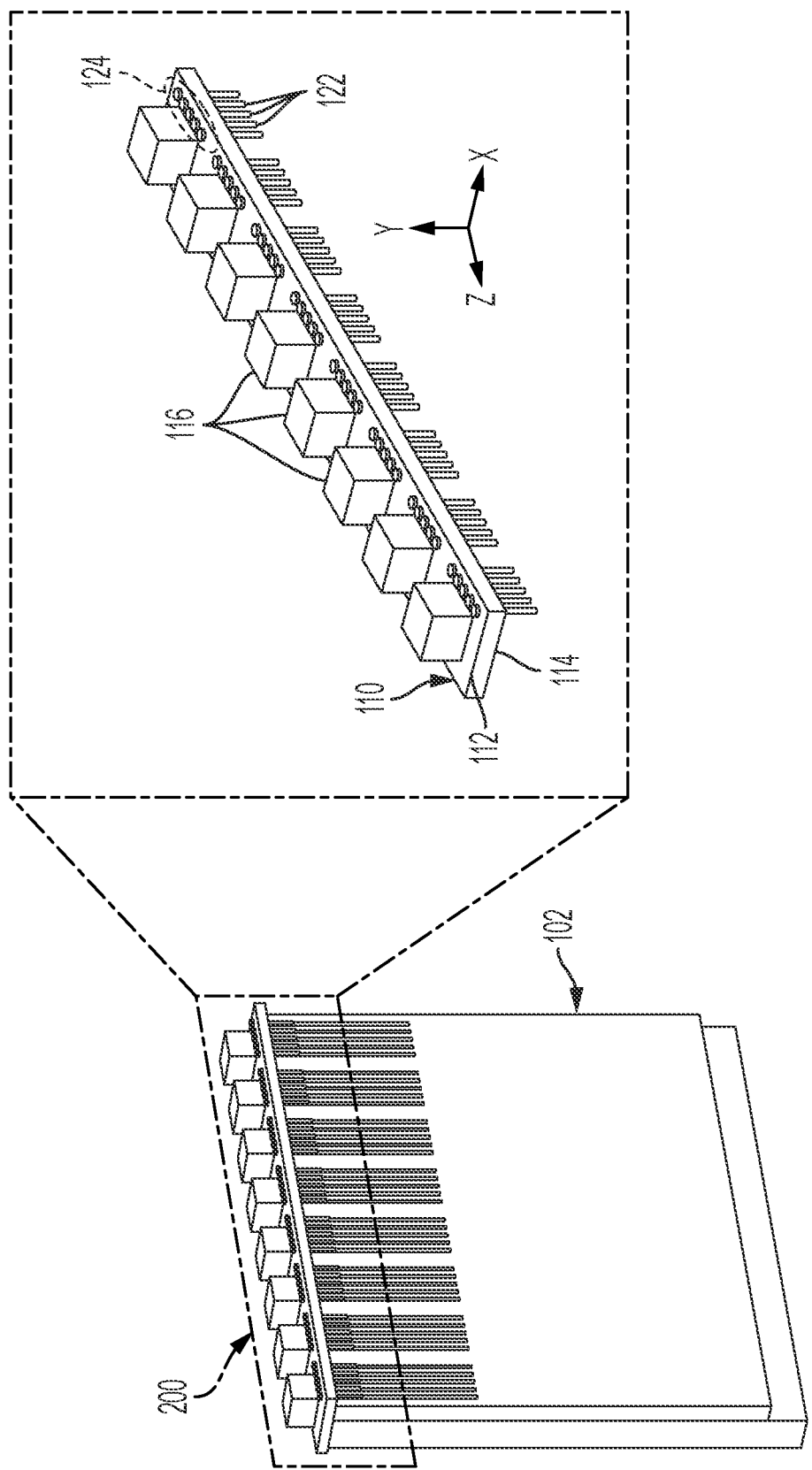
FIG. 3 depicts a radiator PCB included in the orthogonal PCB interface shown in FIG. 2 according to a non-limiting embodiment.
Figure 4:
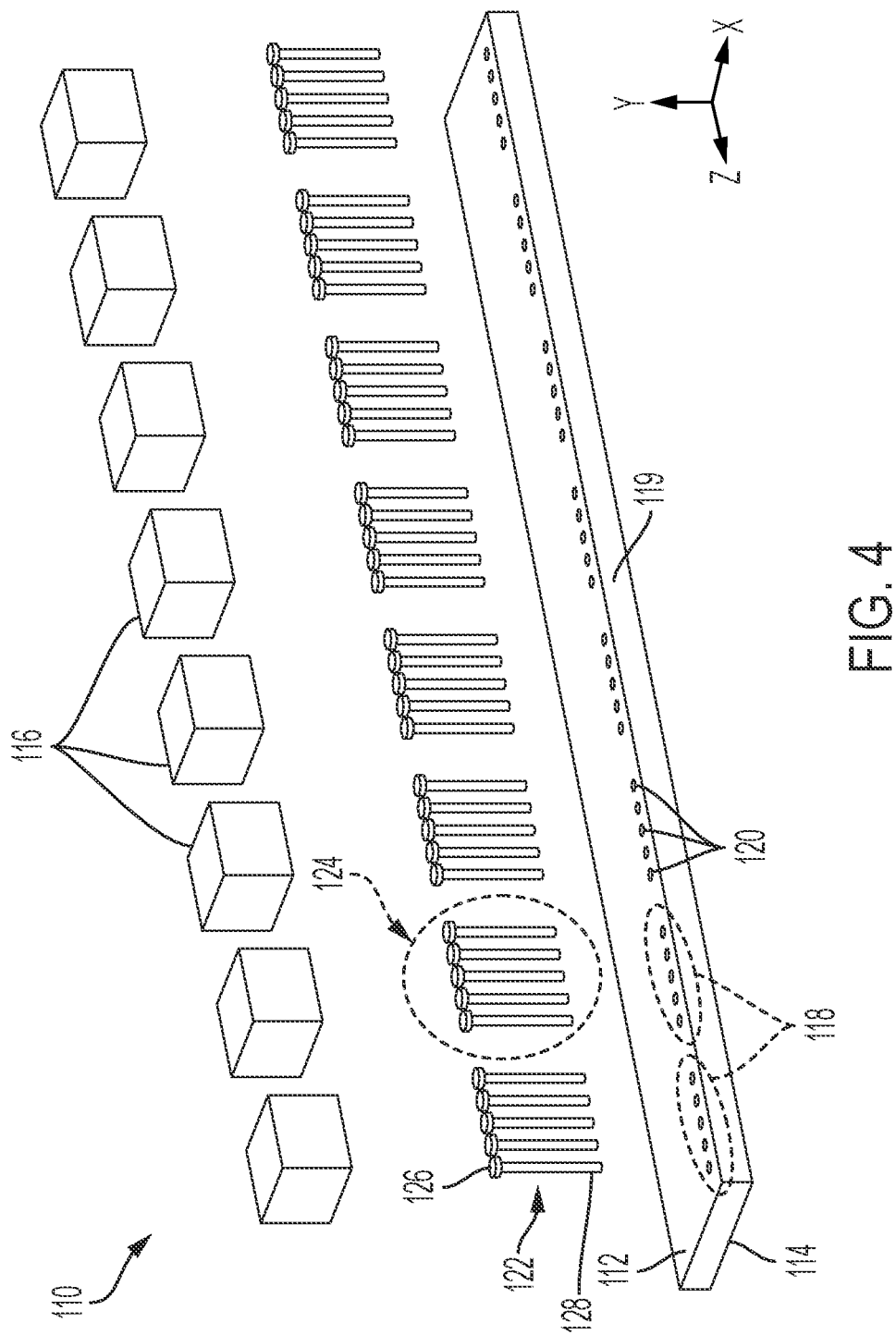
FIG. 4 is a disassembled view of the radiator PCB shown in FIG. 3 according to a non-limiting embodiment.

Still referring to FIG. 2 with additional reference to FIGS. 3 and 4, the radiator substrate 110 has a plurality of through-hole clusters 118 arranged side-by-side along the Z-axis (see FIG. 4). Each through-hole cluster 118 is interposed between a given patch antenna 116 and the first end 119 of the patch mounting surface 112. Each through-hole cluster 118 includes a plurality of through-holes 120 formed in the radiator substrate 110 and extending completely there through from the patch mounting surface 112 to the contact surface 114. Each through-hole 120 is aligned with a respective trace 111 along the Y-axis (shown e.g., in FIG. 2).

The through-holes 120 are configured to receive electrically conductive pins 122 to provide a plurality of pin clusters 124, which are arranged side-by-side along the Z-axis. The pins 122 are formed from an electrically conductive material such as copper, for example, so as to serve as terminals. Each electrically conductive pin 122 extends from a mounting end 126 to an opposing contact end 128 and is disposed in a respective through-hole 120 (see FIG. 3). Accordingly, the mounting end 126 abuts against the patch mounting surface 112 and the contact end 128 contacts an aligned trace 111 as shown in FIG. 2. In one or more non-limiting embodiments, the radiator substrate 110 can include one or more substrate traces (not shown) connecting a given patch antenna 116 to the pins 122 included in an adjacent pin cluster 124. In this manner, signals (e.g., RF signals) applied to the traces 111 of a given trace cluster 109 on the PCB 102 can be deliver to the patch antenna 116 on the radiator substrate 110 via the respectively aligned pins 122. Although five pins 122 are shown, more or less pins 122 can be included based on the number of traces 111 formed on the PCB mounting surface 108.

Referring again to FIG. 2, the assembly of the PCB 102, the traces 111, the radiator substrate 110, and the pins 122 establishes an orthogonal PCB interface 200. As described herein, the orthogonal PCB interface 200 arranges the patch mounting surface 112 of the radiator substrate 110 in an orthogonal position with respect to the PCB mounting surface 108 of the PCB 102. This orthogonal arrangement allows for integrating dual-polarized patch antennas or stacked patch radiators with the PCB s 102 to enable a dual-polarized PCB array antenna 100. In addition, the electrical connection established by the traces 111 and the pins 122 can facilitate a shielded channel interface between the PCB 102 and the patch antennas 116 as described in greater detail below.

Figure 5B:
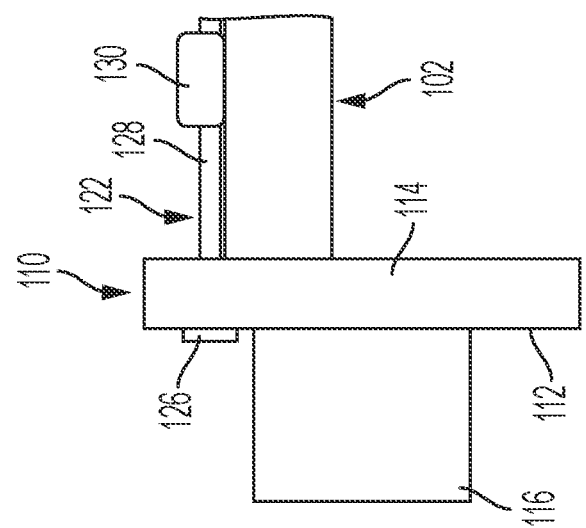
FIG. 5B depicts the patch antenna shown in FIG. 5A coupled to a PCB included in the orthogonal radiator PCB interface shown in FIG. 2 according to a non-limiting embodiment.
Figure 5A:
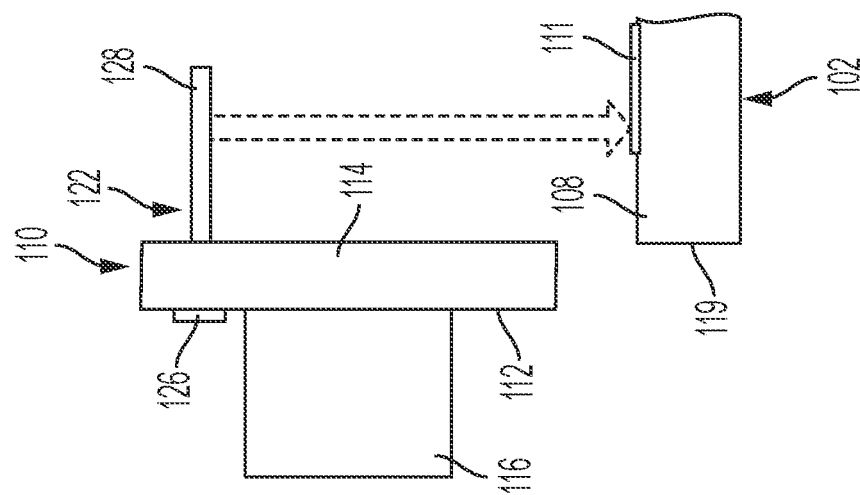
FIG. 5A depicts a patch antenna included in the radiator PCB shown in FIG. 4 according to a non-limiting embodiment.

The connection between the pins 122 and the traces 111 also facilitates dual-polarization RF signal transmission and/or reception without the need to implement large, bulky right-angle connectors. FIGS. 5A and 5B illustrate one example of establishing the pin/trace connection. The pins 122 can be aligned above the traces 111 using, for example a pick-and-place device as understood by those of ordinary skill in the art. Once aligned, the radiator substrate 110 can be placed (as indicated by the dashed arrow) against the PCB 102 such that the contact surface 114 abuts against the first end 119 of the PCB 102 and the pins 122 contact the traces 111 (see FIG. 5A). An electrically conductive filler 130 such as solder, for example, can then be deposited on the PCB mounting surface 108 so as to form an electrically conductive node between the contact end 128 of the pins 122 and the traces 111 (see FIG. 5B). Although the electrically conductive filler 130 is shown as covering a portion of the pin contact end 128, it should be appreciated that the electrically conductive filler 130 can be deposited to cover the entire contact end 128.

Figure 6:
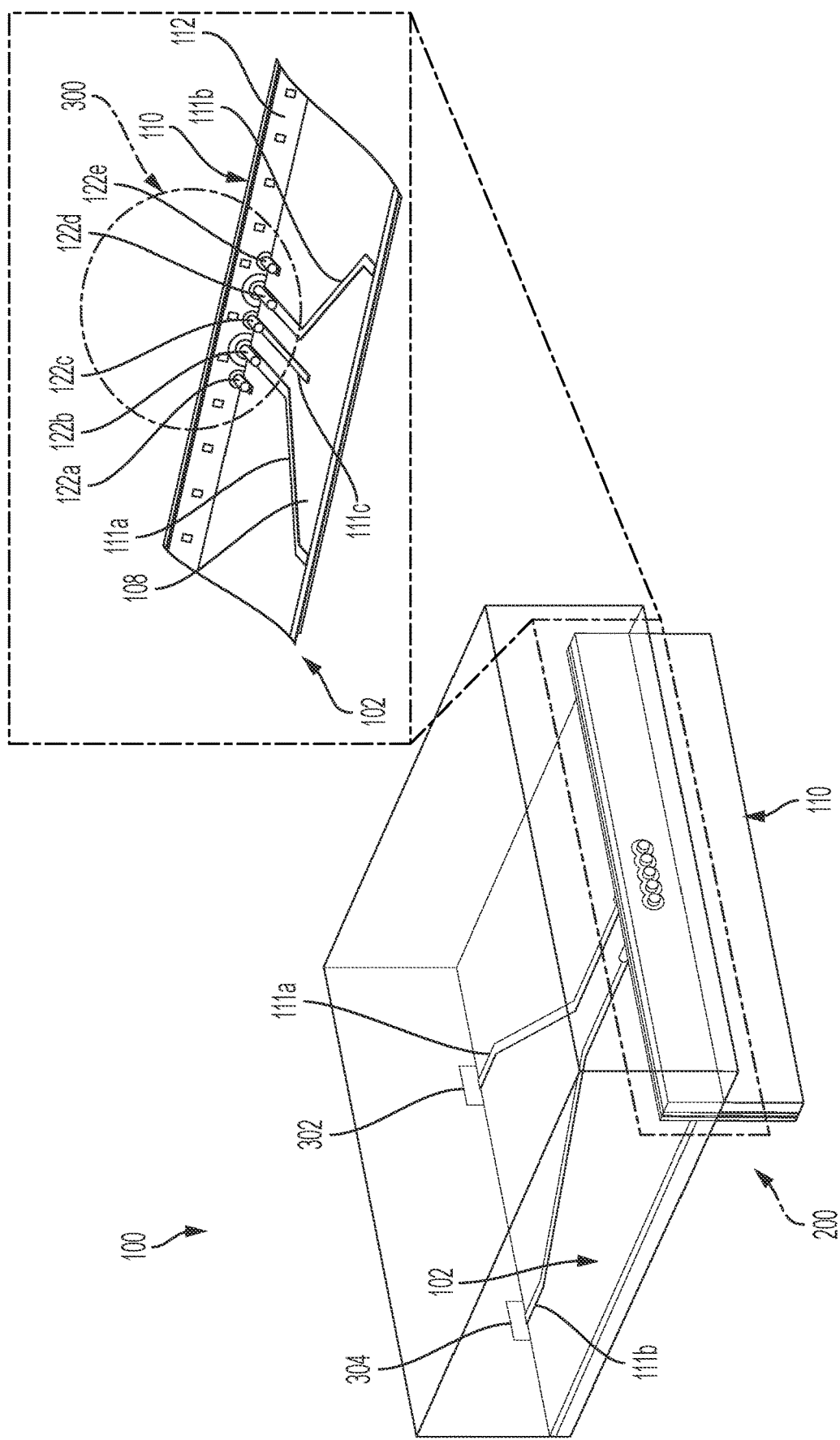
FIG. 6 depicts a shielded channel interface provided by a dual-polarized PCB array antenna according to a non-limiting embodiment.

Turning to FIG. 6, a shielded channel interface 300 is provided by a dual-polarized PCB array antenna 100 is illustrated according to a non-limiting embodiment. As described herein, the dual-polarized PCB array antenna 100 includes a one or more PCBs 102 arranged orthogonally with respect to a radiator substrates 110 via an orthogonal PCB interface 200. Although a single PCB 102 and a single radiator substrate 110 are illustrated, it should be appreciated that additional PCBs 102 and additional substrates 110 can be implemented without departing from the scope of the invention.

According to a non-limiting embodiment shown in FIG. 6, the PCB 102 includes a first plurality of electrically conductive elements 111a, 111b and 111c. In one or more non-limiting embodiments, the first plurality of electrically conductive elements include a first electrically conductive trace 111a, a second electrically conductive trace 111b, and a third electrically conductive trace 111c. In at least one non-limiting embodiment, one or more of the electrically conductive traces 111a-111c are formed on the PCB mounting surface 108 and extend from the first PCB end to the second PCB end. The first trace 111a can be connected to a first port 302, the trace 111b can be connected to a second port 304, and the third electrically conductive trace 111c can be connected to a ground plane using a via (not shown) embedded in the PCB 102. Although the first and second ports 302 and 304 is shown located at the second PCB end, the locations of the first and second ports 302 and 304 are not limited thereto and may be implemented at different locations.

The radiator substrate 110 includes a second plurality of electrically conductive elements 122a, 122b, 122c, 122d, and 122e (collectively referred to as 122a-122e). In at least one non-limiting embodiment, the electrically conductive elements 122a-122e can be formed as electrically conductive pins as described herein, which serve as a plurality of terminals to facilitate the shielded channel interface 300 In at least one non-limiting embodiment, the electrically conductive elements 122a-122e extend perpendicular with respect to the patch mounting surface 112 of the radiator substrate 110. Accordingly, a second electrically conductive element (e.g., a pin 122a-122e) can contact a respective first electrically conductive element (e.g., a trace 111a-111c).

As shown in FIG. 6, for example, terminal 122b can be connected to the first trace 111a while terminal 122d can be connected to the second trace 111b. Terminals 122a, 122c and 122e can be connected to vias (not shown), which are embedded in the PCB 102, and are shorted to a ground plane. Accordingly, a ground-signal-ground-signal-ground (GSGSG) shielded channel interface 300 is established that allows for maintaining ground potentials between both the PCB 102 and the radiator substrate 110 throughout the system while RF signals are applied to terminals 122b and 122d and delivered to the first and second terminals 111a and 111b, respectively. It should be appreciated that the terminals 122a-122e are not limited to a GSGSG configuration, and that other terminal configurations capable of establishing a shielded channel interface 300 can be employed without departing from the scope of the present disclosure.

Figure 7:
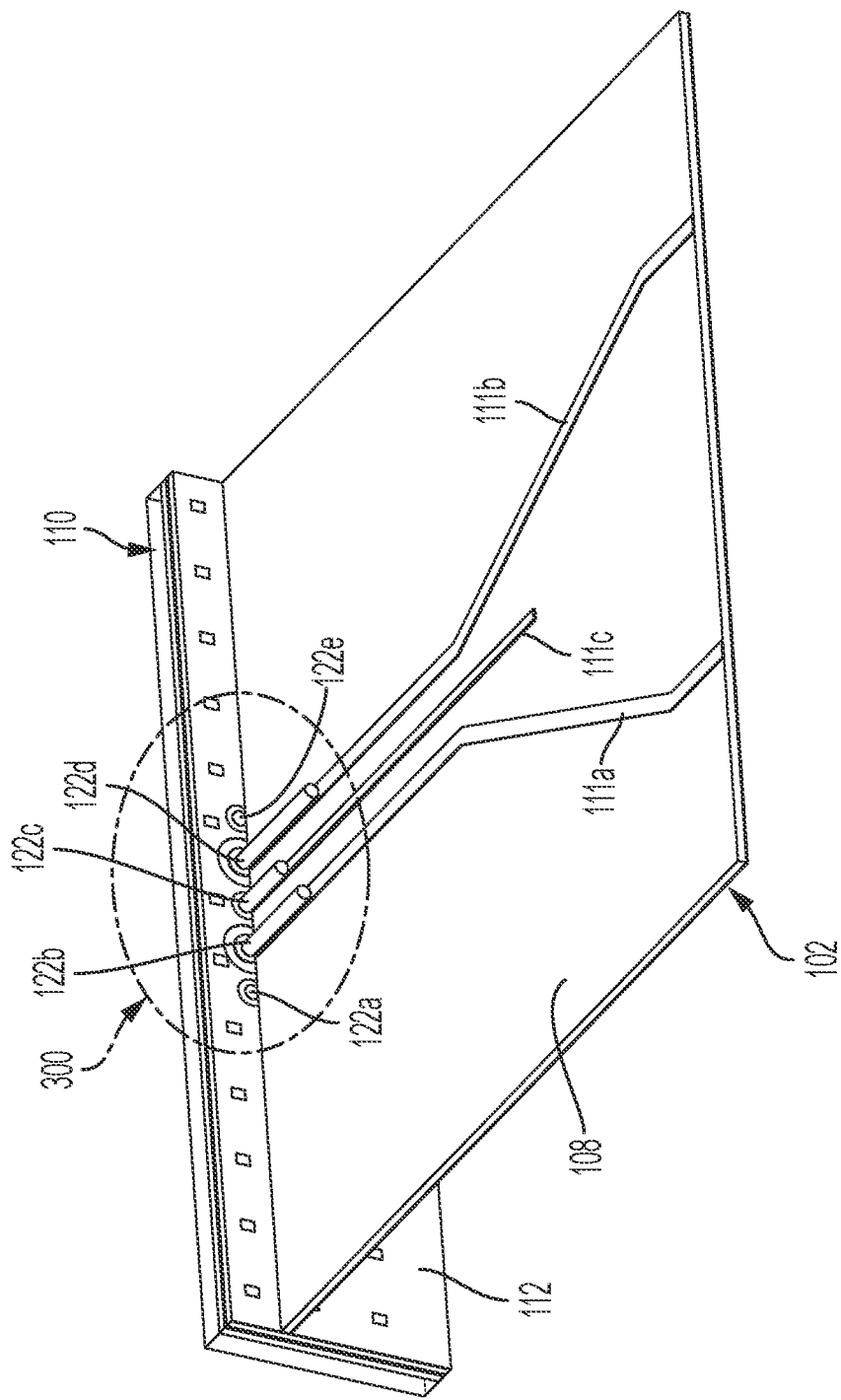
FIG. 7 depicts a shielded channel interface provided by a dual-polarized PCB array antenna according to another non-limiting embodiment.

According to a non-limiting embodiment shown in FIG. 7, a shielded channel interface 300 can be established by utilizing the inner terminals 122b, 122c and 122d without utilizing the outer-most terminals 122a and 122e. In this example, terminal 122c can serve as a ground terminal that is interposed (i.e., sandwiched) between first and second RF terminals 122b and 122d. Accordingly, an RF signal-ground-signal (SGS) shielded channel interface 3000 is established that facilitates a signal interface between the PCB 102 and the radiator substrate 110. Although a SGS shielded channel interface 300 is described, the configuration is not limited thereto. For example, a ground-signal-ground (GSG) shielded channel interface 300 can be established without departing from the scope of the present disclosure by utilizing terminal 122c as an RF terminal that is interposed (i.e., sandwiched) between first and second ground terminals 122b and 122d.

As described herein, various non-limiting embodiments provide an orthogonal interface for implementation in a dual-polarized PCB array antenna. The orthogonal interface overcomes the need to implement twin PCBs, while facilitating efficient dual-polarization via dual-polarized patch and stacked patch radiators integrated on one or more PCBs.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A dual-polarized printed circuit board (PCB) array antenna comprising:
    a plurality of PCBs, each PCB extending along a first axis to define a PCB width, a second axis orthogonal to the first axis to define a PCB height, and a third axis orthogonal to the first axis and the second axis to define a PCB length, each PCB having a PCB mounting surface that extends along the second axis from a first PCB end to an opposing second PCB end and along the third axis from a third PCB end to a fourth PCB end,
    a radiating antenna array including a plurality of radiator substrates, each radiator substrate having a patch mounting surface that extends along the first axis from a first substrate end to an opposing second substrate end and the third axis from a third substrate end to an opposing fourth substrate end; and
    a plurality of orthogonal interfaces configured to arrange the patch mounting surface of a given radiator substrate among the plurality of radiator substrates in an orthogonal position with respect to the PCB mounting surface of a given PCB among the plurality of PCBs,
    wherein a given orthogonal interface among the plurality of orthogonal interfaces arranges the patch mounting surface of the given radiator substrate in the orthogonal position with respect to the PCB mounting surface the given PCB, and
    wherein the given orthogonal interface comprises:
        a plurality of electrically conductive traces formed on the given PCB mounting surface; and
        a plurality of electrically conductive pins extending through the patch mounting surface and contacting the electrically conductive traces,
    wherein the radiating antenna array includes a plurality of radiating antenna elements disposed on the patch mounting surface.

2. The dual-polarized PCB array antenna of claim 1, wherein each radiator substrate is disposed on the first end of a respective PCB.

3. The dual-polarized PCB array antenna of claim 1, wherein the contact between the plurality of electrically conductive traces and the plurality of electrically conductive pins establishes a shielded channel interface.

4. The dual-polarized PCB array antenna of claim 3, wherein the shielded channel interface includes a ground-signal-ground configuration.

5. The dual-polarized PCB array antenna of claim 3, wherein the shielded channel interface includes a signal-ground-signal configuration.

6. A dual-polarized printed circuit board (PCB) array antenna comprising:
    a plurality of PCBs, each PCB extending along a first axis to define a PCB width, a second axis orthogonal to the first axis to define a PCB height, and a third axis orthogonal to the first axis and the second axis to define a PCB length, each PCB having a PCB mounting surface that extends along the second axis from a first PCB end to an opposing second PCB end and along the third axis from a third PCB end to a fourth PCB end,
    a radiating antenna array including a plurality of radiator substrates, each radiator substrate having a patch mounting surface that extends along the first axis from a first substrate end to an opposing second substrate end and the third axis from a third substrate end to an opposing fourth substrate end; and
    a plurality of orthogonal interfaces configured to arrange the patch mounting surface of a given radiator substrate among the plurality of radiator substrates in an orthogonal position with respect to the PCB mounting surface of a given PCB among the plurality of PCBs, wherein a given orthogonal interface among the plurality of orthogonal interfaces arranges the patch mounting surface of a given radiator substrate in an orthogonal position with respect to the PCB mounting surface a given PCB, and
    wherein the given orthogonal interface comprises:
        a plurality of electrically conductive traces formed on the given PCB mounting surface; and
        a plurality of electrically conductive pins extending through the patch mounting surface and contacting the electrically conductive traces,
    wherein the contact between the plurality of electrically conductive traces and the plurality of electrically conductive pins establishes a shielded channel interface.

* * * * *